United States Patent [19]
Farrar et al.

[11] Patent Number: 4,679,013
[45] Date of Patent: Jul. 7, 1987

[54] FILTERED ELECTRICAL CONNECTOR

[75] Inventors: John C. Farrar, Harrisburg; Reuben E. Ney, Mount Joy; James L. Schroeder, III, Palmyra, all of Pa.

[73] Assignee: AMP Incorporated, Harrisburg, Pa.

[21] Appl. No.: 811,605

[22] Filed: Dec. 20, 1985

[51] Int. Cl.$^4$ .................. H03H 7/01; H01R 13/66
[52] U.S. Cl. .................... 333/182; 439/607; 439/620
[58] Field of Search .............. 333/167, 181–185; 339/14 R, 143 R, 147 R

[56] References Cited

U.S. PATENT DOCUMENTS

| | | | |
|---|---|---|---|
| 3,002,162 | 9/1961 | Garstang | 333/183 X |
| 3,721,869 | 3/1973 | Paoli | 333/183 X |
| 4,079,343 | 3/1978 | Nijman | 333/183 |
| 4,126,370 | 11/1978 | Nijman | 333/183 X |
| 4,144,509 | 3/1979 | Boutros | 333/185 X |
| 4,494,092 | 1/1985 | Griffin | 333/182 X |
| 4,519,665 | 5/1985 | Althouse et al. | 339/147 R |

Primary Examiner—Paul Gensler
Attorney, Agent, or Firm—Katherine A. Nelson

[57] ABSTRACT

A filtered electrical connector for connection to a complementary electrical connector is disclosed. The connector is comprised of a dielectric housing means having a plurality of terminal receiving passageways therein; electrical terminal means disposed in the terminal receiving passageways, the terminal means being terminated onto electrical conductor means; filter means electrically coupled to the conductor means; grounding means electrically coupled to the filter means; and conductive housing means for receiving the dielectric housing means. The conductive housing means is electrically connectable to the grounding means. In accordance with the invention, the filter means may be tubular sleeve members or a monolithic planar filter member.

20 Claims, 6 Drawing Figures

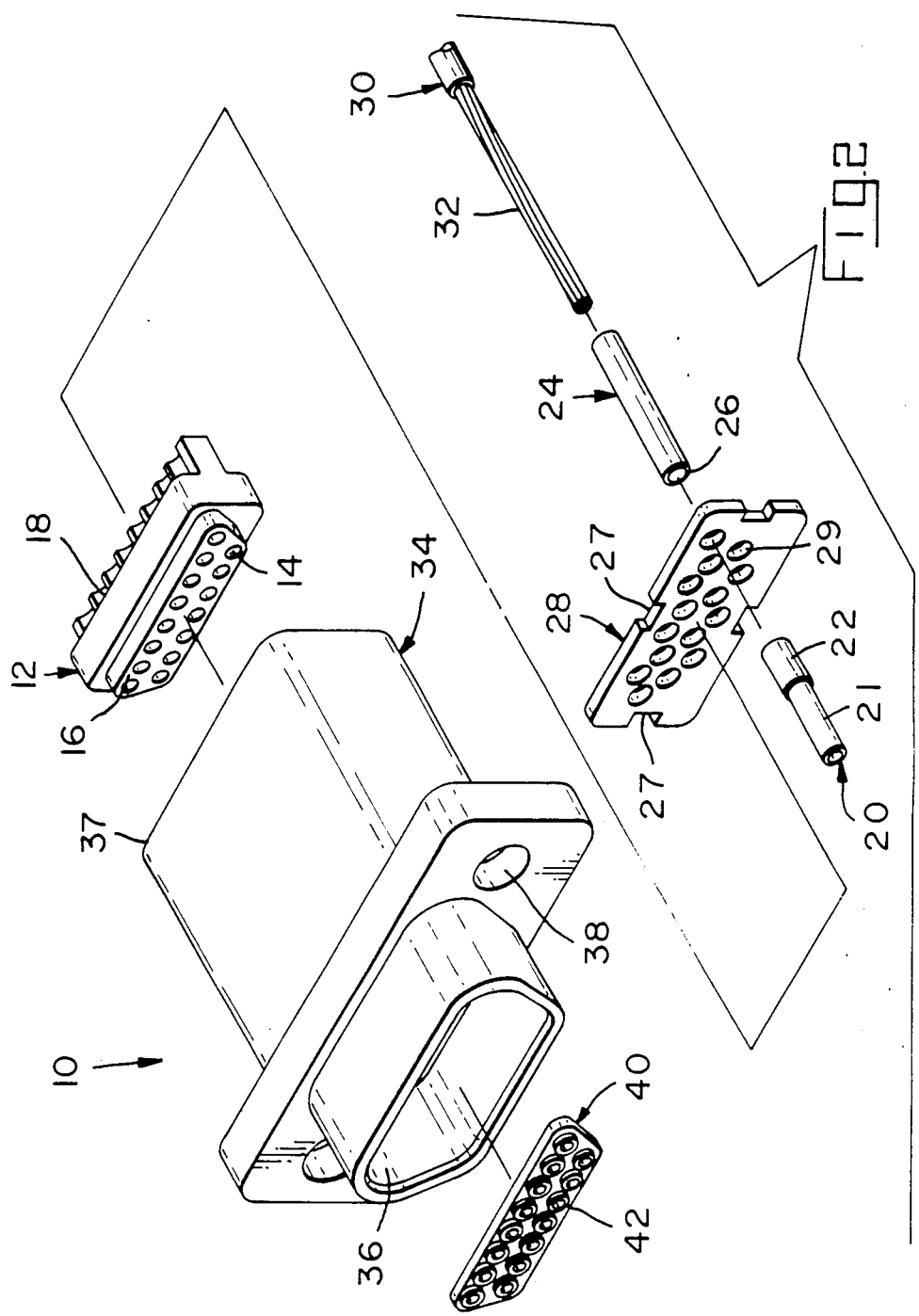

FILTERED ELECTRICAL CONNECTOR

FIELD OF THE INVENTION

The present invention relates to electrical connectors and more specifically to high density filtered connectors.

BACKGROUND OF THE INVENTION

There is an increasing need for connectors that provide filtering capability as well as high density interconnections. Furthermore, there is need for miniature and micro-miniature connectors that provide filtering capability.

Typically filtered connectors are of the type disclosed in U.S. Pat. Nos. 3,710,285, 4,020,430 and 4,296,390, wherein the terminal members are individually inserted into and electrically connected to a filter sleeve.

Planar filter members may also be used to filter connectors such as those disclosed in U.S. Pat. No. 4,376,922. Use of filter sleeves and planar filter elements in the manner described above requires either that the interior of the connector be of sufficient size to accommodate the filter members or that portions of the terminals project from the housing in a sufficiently spaced apart relationship to accommodate the filter members. Furthermore, it is important that the filtered terminals be sufficiently spaced apart to maintain electrical isolation between adjacent lines and concomitantly maintain the spatial arrangement of the portion of the terminals required for mating with complementary connectors.

Space is at a premium in miniature and micro-miniature connectors, particularly when the connectors are of the high density type of terminals spaced on center lines 0.040 inches apart with as little as 0.08 inches of insulated space between adjacent openings in the housings. In connectors of this size, there simply is insufficient room within the connector housing to accommodate filter means mounted in the traditional manner.

Accordingly, it is an object of the present invention to provide a filtered high density connector.

In addition, it is an object of this invention to provide a filtered miniature and micro-miniature connector.

It is further object of the invention to provide a filtered connector that is compatible with and matable with standard nonfiltered complementary connectors.

SUMMARY OF THE INVENTION

The electrical connector of the present invention is comprised of a dielectric housing means having a plurality of terminal receiving passageways extending therethrough; electrical terminal means disposed in the terminal receiving passageways, the terminal means being terminated onto electrical conductor means; filter means electrically coupled to said conductor means; grounding means electrically coupled to said filter means; and conductive housing means having passageway means therein for receiving the dielectric housing means, the conductive housing means being electrically connectable to the grounding means. The filter means may be tubular filter sleeve members or a monolithic planar filter member.

Some of the objects and advantages of the invention having been stated, others will appear as the description proceeds, when taken in connection with the accompanying drawings.

BRIEF DESCRIPTION OF THE DRAWINGS

FIG. 2 is an exploded perspective view of the filtered electrical connector of FIG. 1.

DETAILED DESCRIPTION OF THE DRAWINGS

Figure 1:
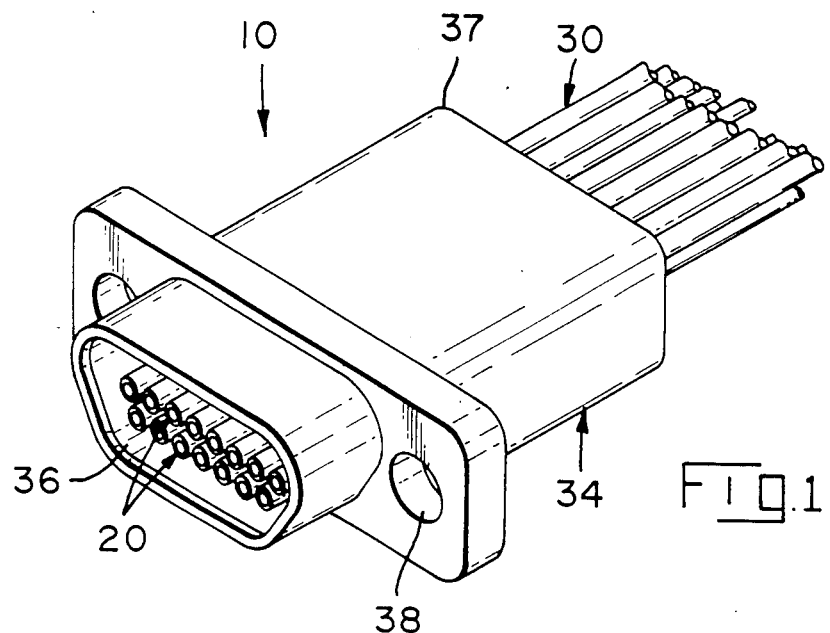
FIG. 1 is a perspective view of a filterd electrical connector in accordance with the invention.

FIGS. 1 and 2 show assembled and an exploded view of the filtered electrical connector 10 of the present invention. The connector 10 is comprised of a dielectric housing member 12; a plurality of electrical terminal members 20, a plurality of filter sleeves 24, a grounding means 28, a shield member 34 and an insert member 40. Connector 10 is used to interconnect and filter a plurality of conductor members 30. It is to be understood that the receptacle illustrating the invention is a representative sample of electrical connectors that may be filtered in accordance with the invention. Plugs, as well as receptacles may be filtered and the terminal members may be of other designs.

Figure 3:
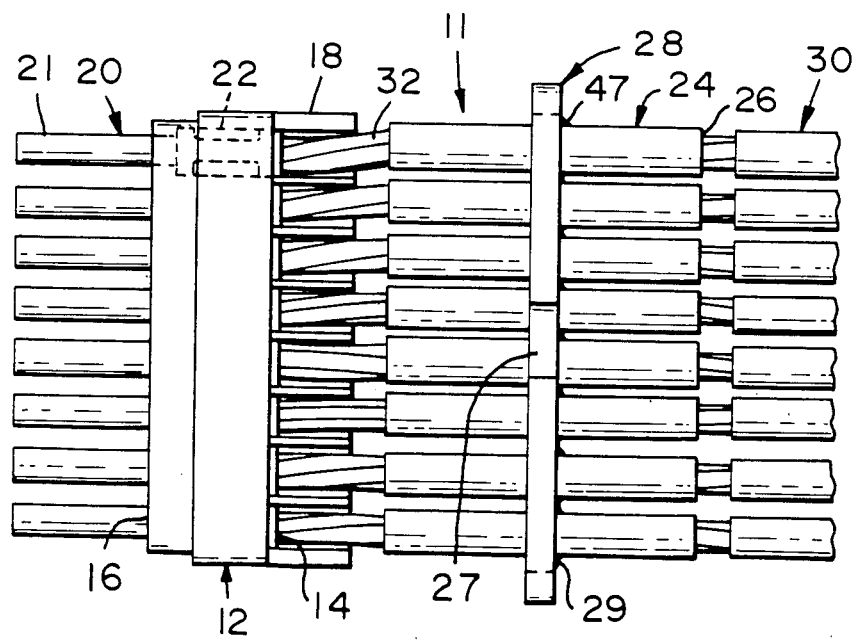
FIG. 3 is a top plan view of the assembled connector of FIG. 2 with the shell removed.
Figure 4:
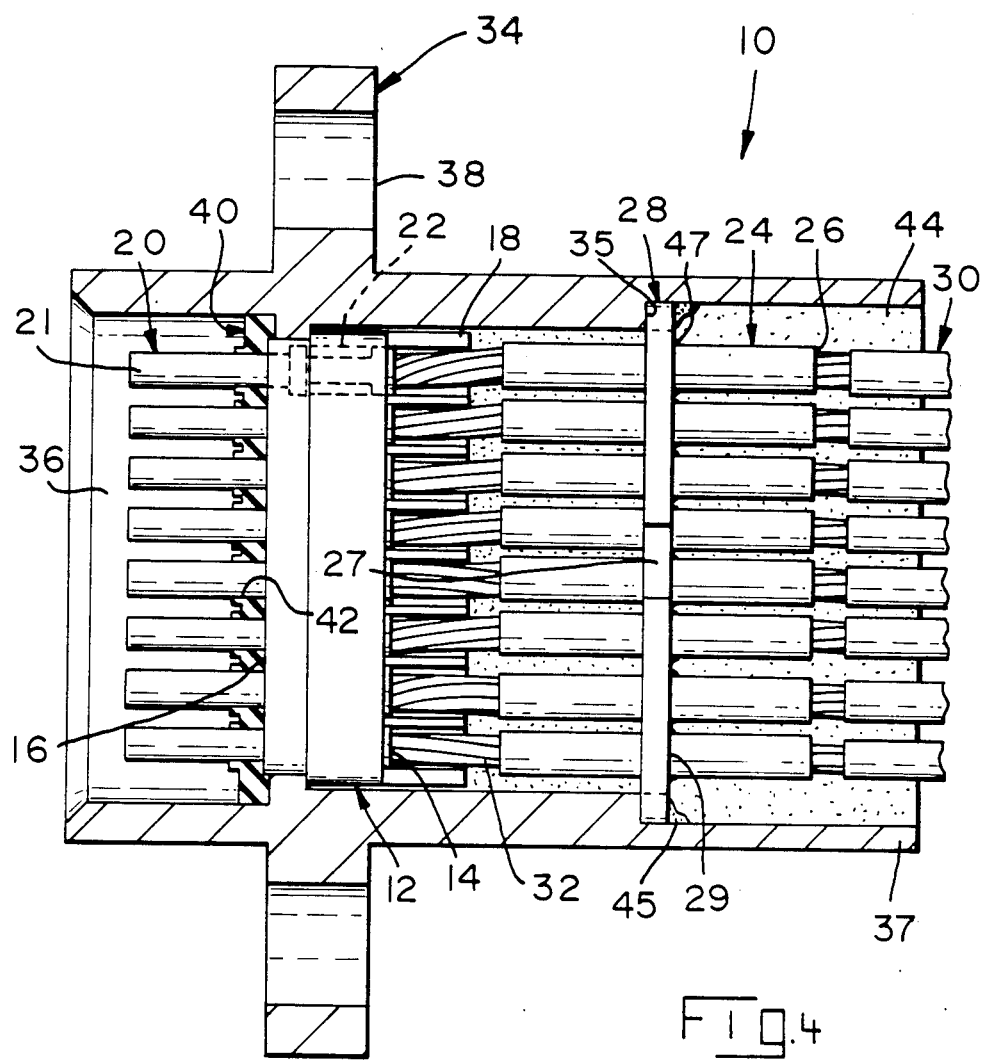
FIG. 4 is a cross-sectional view of the connector taken along line 4—4 of FIG. 1.

Dielectric housing means 12 has a plurality of terminal receiving passageways 14 therein which extend from the front face 16 to the rear 18 of housing means 12. Electrical terminal means 20 are comprised of a front mating portion 21 for mating with complementary terminals and a ferrule portion 22. Terminal means 20 are disposed in respective terminal receiving passageways 14 of dielectric housing means 12. Terminal means 20 are designed to be terminated to conductor means 30. As is shown in the preferred embodiment, the conductor means 30 is insulated wire having a stripped portion 32. A filter sleeve member 24 is disposed over and electrically coupled to the stripped portion 32 of conductor means 30. The stripped portion 32 must be of sufficient length to pass through the filter member 24, the grounding means 28 and be terminated in the ferrule portion 22 of the terminal means 20, as is best seen in FIGS. 3 and 4. Shielding means are provided comprising a shell 34 having cavity 36 therein which surrounds the housing 12, the terminal members 20, filter means 24, grounding means 28, and portion of the conductors 30. After the connector 10 is assembled it preferably is potted. As is shown in FIG. 4, potting material 44 extends from the rear 37 of the shell 34 into cavity 36 surrounding ends of conductors 30, the filters 24, and the exposed sections of conductor members 30.

The front insert member 40, preferably of an elastomeric material, having a plurality of apertures 42 arranged in the same configuration as that of the housing 12 is disposed over the ends of the terminals 20 and rests against the front face 16 of housing 12. The resilient insert member 40 provides sealing means when connector 10 is mated with a complementary connector.

The connector is assembled in the following manner as can best be seen in FIGS. 3 and 4. A portion of the insulation is stripped from the conductors 30 to expose portions 32. A filter sleeve member 24, comprising a thin wall tubular capacitor member is soldered to an exposed section of each of the wires. The ends of filtered wires 32 are inserted into and crimped, soldered or otherwise attached to ferrule portions 22 of electrical terminals 20. The terminated and filtered ends of conductor members 30 are then inserted into respective apertures 29 of ground plane 28 until the filter members 24 rest in their respective apertures 29, which are dimensioned to receive the filter members 24. The filter sleeve members 24 are preferably soldered at 47 to apertures 29 in the ground plane 28 to ensure electrical engagement therewith. Terminals 20 are then inserted into corresponding passageways 14 in housing member 12. Alternatively, the ends of filtered conductor members 30 may be inserted through apertures 29 in ground plane 28 prior to being terminated to terminal members 20. The alternative method would be used primarily when the shape and dimensions of terminal member 20 preclude it from passing through aperture 29.

The structure of the preferred embodiment as shown in FIGS. 3 and 4 and described herein is especially suitable for miniature and micro-miniature connectors because thin wall tubular filter members are mounted onto and electrically connected to exposed wire, thus keeping the size of the filtered line at a minimum. In addition the apertures 29 in ground plane 28 may be staggered to accommodate the increased size of the filtered portion of conductor means 30 while permitting the terminals to maintain a more closely spaced configuration in the housing member.

Thin wall tubular capacitive filter members are readily available. It is be understood that other types and sizes of filter sleeve members such as those disclosed in U.S. Pat. No. Re. 29,258 may be used where space permits.

The filtered assembly is inserted into shell member 34 so that the grounding plate 28 engages the walls of the metal shell 34 at 35 thus providing grounding for the individual lines within the connector. The ground plate 28 may be soldered or adhered with conductive adhesive to shell 34 at 45 to ensure electrical continuity. The connector 10 itself is grounded through the grounding shell 34 to a panel by connector mounting hardware inserted through mounting means 38 of the shell 34. A resilient front insert member 40 is inserted over the terminal members 20 and front face 16 of housing 12 after the filter assembly 11 has been inserted into the shell 34. It is to be understood that the socket type terminal 20 is representative of various electrical terminals that may be filtered in this manner.

FIG. 3 shows the filter assembly 11 prior to insertion into the metal shell 34. Since the filter sleeves 24 are mounted on the wire 32 rather than on the terminal members 20, the highly dense arrangement of the terminal members 20 may be maintained even for miniature and micro-miniature connectors. The embodiment 10 as best seen in FIG. 1, illustrates a connector having a double row of closely packed terminals. Furthermore, because the ground plane 28 is spaced apart from the dielectric housing member 12 the apertures 29 in the ground plate may be spaced further apart than passageways 14 to accommodate the enlarged filtered wire without destroying the arrangement of the contact terminal members 20 in the housing 12.

FIG. 4 shows the filter assembly 11 mounted into shell member 34 with terminal members 20 inserted into apertures 42 of the front insert member 40 which is disposed against the front surface 16 of the housing 12. FIG. 4 also shows the ground plane member 28 in engagement with the shell member 34. To ensure electrical contact ground plane member 28 may be soldered or adhered with conductive material at 45. Potting material 44 extends into cavity 36 from the rear face 37 of the shell member 34. The potting material is inserted from the rear 37 of shell 34 and passes through notches 27 along the periphery of ground plane member 28 to fill the portion of cavity 36 that extends behind housing member 12. Potting material 44 is used to maintain electrical isolation between the closely packed conductors and to provide sufficient support and structural strength to the connector 10.

Figure 5:
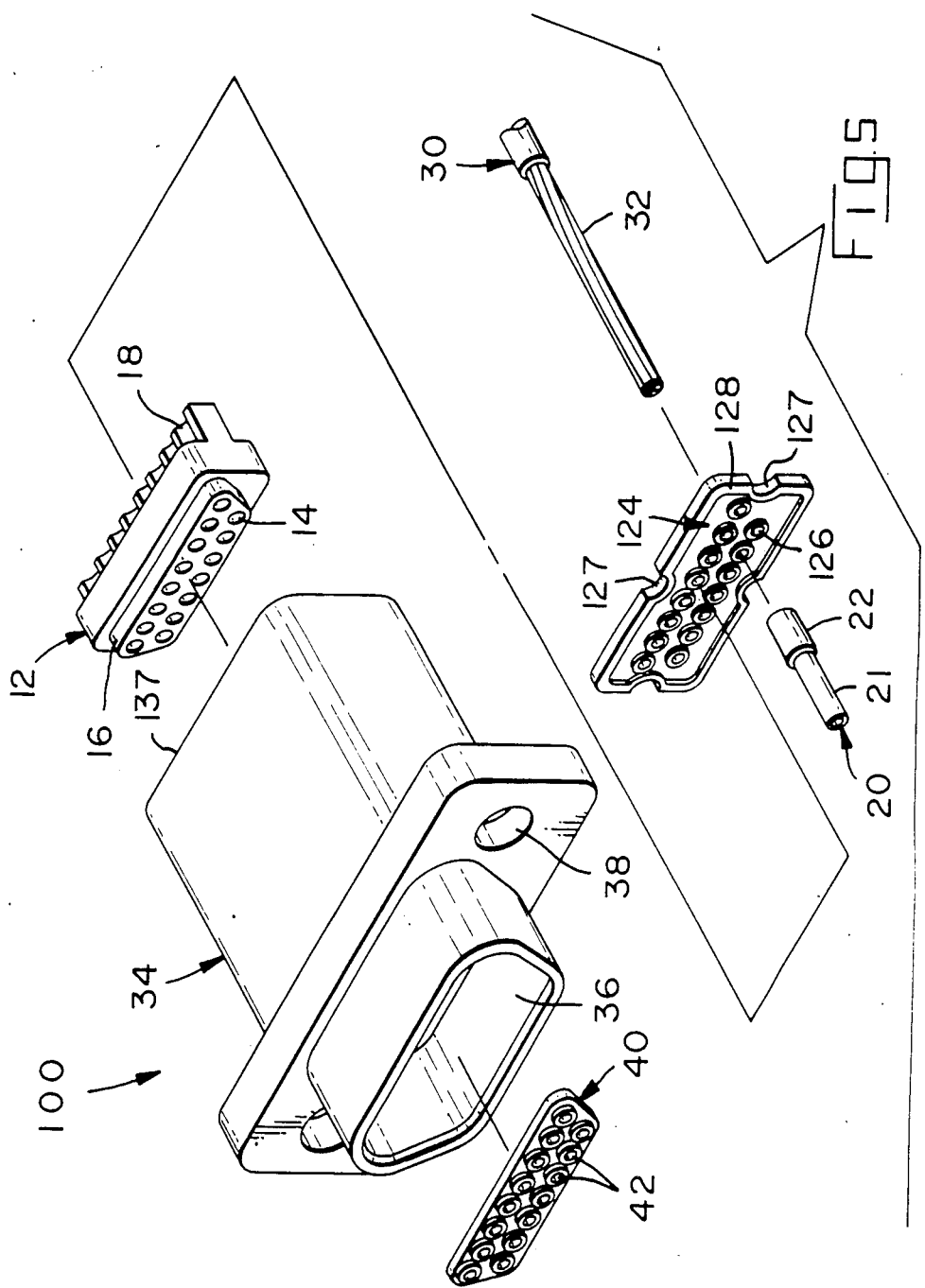
FIG. 5 is an exploded perspective view of an alternative embodiment of the connector of FIG. 1.
Figure 6:
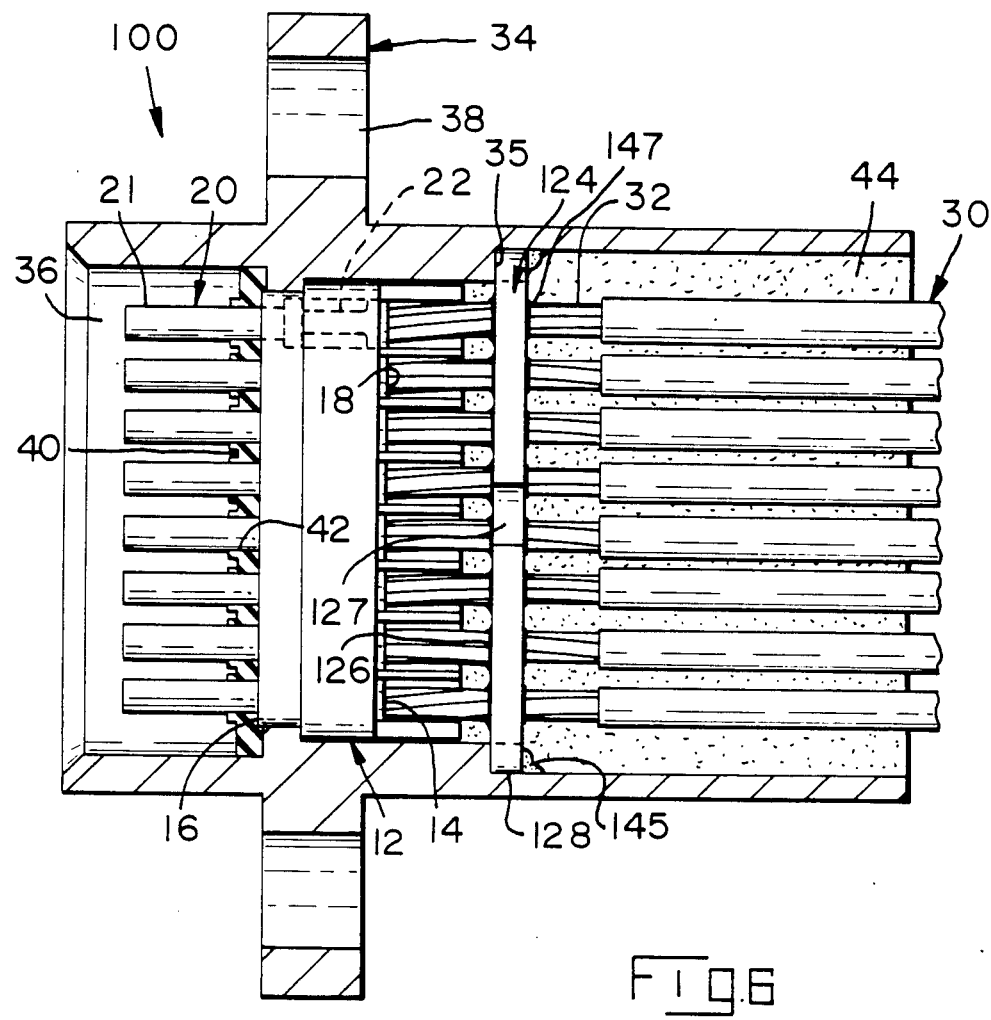
FIG. 6 is a cross-sectional view of the connector of FIG. 5.

FIGS. 5 and 6 show an alternative embodiment 100 of the filter connector of the present invention. In this embodiment the filter means is a planar capacitor 124 having apertures 126 therethrough. Planar capacitor members are generally multilayer members having individual ground paths from each aperture to the outside edges of the planar member. In the preferred embodiment the grounding means 128 includes a layer of conductive material disposed on the outside edges of the front and back surfaces and along the edges of the planar capacitor 124 as is shown in FIG. 5. Planar capacitor member 124, therefore, combines the filtering and grounding capabilities in one unit. The planar capacitor member further has notches 127 along its periphery to provide a path for the potting material to reach the interior of the connector. In assembling the connector of this embodiment the stripped portions of the wire 32 are inserted into apertures 126 of filter member 124, and preferably soldered thereto at 147. The ends of the stripped wire 32 are inserted into the ferrules of terminal members 20 and soldered, crimped, or otherwise attached to ferrules 22. The filtered assembly is inserted into shell 34 such that the edges of the planar capacitor member 124 rest against ledge 35 of shell member 34. Solder or other conductive material is applied at 145 to ensure good electrical conductivity for grounding purposes. This embodiment 100 of the connector is preferably potted with material 44 to maintain electrical isolation of the conductor members and to provide support and strain relief for the connector.

In the drawing to specification, there has been set forth preferred embodiments of the invention, and although specific terms are employed, they are used in a generic and description sense only, and are not for purposes of limitation.

We claim:

1. A filtered electrical connector for connectin to a complementary electrical connector, comprising:
   a dielectric housing means having a plurality of terminal receiving passageways extending therethrough;
   electrical terminal means disposed in said terminal receiving passageways, said terminal means being terminated onto insulated electrical conductor means;
   filter means disposed on and electrically coupled to exposed conductive portions of said conductor means;
   grounding means electrically coupled to said filter means; and
   conductive housing means for receiving said dielectric housing means, said conductive housing means being electrically connected to said grounding means.

2. The filtered electrical connector as described in claim 1 wherein said electrical connector is further comprised of means for securing said filter means and said grounding means in said conductive housing means.

3. The filtered electrical connector as described in claim 1 wherein said electrical connector is further comprised of a resilient sealing member, having a plurality of apertures extending therethrough, said apertures being dimensioned to sealingly engage a portion of said electrical terminal means, said sealing member being disposed against said dielectric housing member such that said portions of said electric terminal means extend through said sealing member apertures.

4. The filtered electrical connector as described in claim 1 wherein said filter means is a monolithic planar filter element having a plurality of apertures extending therethrough, each aperture having one of said exposed conductive portions of said conductor means disposed therein.

5. The filtered electrical connector as described in claim 1 wherein said filter means is a tubular filter sleeve member disposed on said exposed conductive portions of said conductor means.

6. The filtered electrical assembly as described in claim 5 wherein said grounding means is a ground plane having a plurality of apertures therethrough for receiving said filter sleeves.

7. A filtered electrical assembly comprising:
a dielectric housing means having a plurality of terminal receiving passageways extending therethrough;
electrical terminal means disposed in said terminal receiving passageways, said terminal means being terminated onto insulated electrical conductor means;
filter means disposed on and electrically coupled to exposed conductive portions of said conductor means; and
grounding means electrically coupled to said filter means.

8. The filtered electrical assembly as described in claim 7 wherein said filter means is a monolithic planar filter element having a plurality of apertures extending therethrough, each aperture being dimensioned to receive one of said exposed conductive portions of said conductor means.

9. The filtered electrical assembly as described in claim 7 wherein said filter means is a tubular filter sleeve member disposed on said exposed conductive portions of said conductor means.

10. The filtered electrical assembly as described in claim 9 wherein said grounding means is a ground plane having a plurality of apertures therethrough for receiving said filter sleeves.

11. A filtered electrical connector for connection to a complementary electrical connector, comprising:
a dielectric housing means having a plurality of terminal receiving passageways extending therethrough;
electrical terminal means disposed in said terminal receiving passageways, said terminal means being terminated onto insulated electrical conductor means;
filter means disposed on and electrically coupled to exposed conductive portions of said conductor means,
grounding means electrically coupled to said filter means; and
conductive means for providing a ground path from said grounding means to ground plane.

12. The filtered electrical connector as described in claim 11 wherein said conductive means is comprised of a conductive housing member having a passageway means for receiving said dielectric housing means, said passageway means being electrically coupled to said grounding means, said conductive housing member having conductive mounting means for electrical engagement with said ground plane.

13. The filtered electrical connector as described in claim 11 wherein said filter means is a monolithic planar filter element having a plurality of apertures extending therethrough, each aperture having one of said exposed conductive portions of said conductor means disposed therein.

14. The filtered electrical connector as described in claim 11 wherein said electrical connector is further comprised of a resilient sealing member, having a plurality of apertures extending therethrough, said apertures being dimensioned to sealingly engage a portion of said electrical terminal means, said sealing member being disposed against said dielectric housing member such that said portions of said electric terminal means extend through said sealing member apertures.

15. The filtered electrical connector as described in claim 14 wherein said electrical connector is further comprised of means for securing said filter means and said grounding means in said conductive housing member.

16. The filtered electrical connector as described in claim 11 wherein said filter means is a tubular filter sleeve member disposed on said exposed conductive portions of said conductor means.

17. The filtered electrical assembly as described in claim 16 wherein said grounding means is a ground plane having a plurality of apertures therethrough for receiving said filter sleeves.

18. An electrical connector for matable electrical connection with a complementary electrical connector, comprising:
housing means having passageway means extending therethrough;
dielectric means disposed in said passageway means, said dielectric means having a plurality of terminal receiving passageways extending therethrough;
electrical terminal means disposed in said terminal receiving passageways, said terminal means being terminated onto insulated electrical conductor means;
filter means disposed on and electrically coupled to exposed conductive portions of said conductor means;
grounding means electrically coupled to said filter means; and
conductive means for providing a grounding path from said grounding means to a ground plane to ground said connector.

19. The filtered electrical connector as described in claim 18 wherein said filter means is a tubular filter sleeve member disposed on said exposed conductive portions of said conductor means.

20. The filtered electrical connector as described in claim 18 wherein said filter means is a monolithic planar filter element having a plurality of apertures extending therethrough, each aperture having one of said exposed conductive portions of said conductor means disposed therein.

* * * * *